(12) United States Patent
Lv et al.

(10) Patent No.: US 9,876,037 B2
(45) Date of Patent: Jan. 23, 2018

(54) THIN-FILM TRANSISTOR ARRAY SUBSTRATE AND MANUFACTURING METHOD THEREOF

(71) Applicant: Shenzhen China Star Optoelectronics Technology Co., Ltd., Shenzhen (CN)

(72) Inventors: Xiaowen Lv, Shenzhen (CN); Chihyu Su, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 7 days.

(21) Appl. No.: 14/762,813

(22) PCT Filed: May 25, 2015

(86) PCT No.: PCT/CN2015/079668
§ 371 (c)(1),
(2) Date: Jul. 23, 2015

(87) PCT Pub. No.: WO2016/173027
PCT Pub. Date: Nov. 3, 2016

(65) Prior Publication Data
US 2016/0315105 A1    Oct. 27, 2016

(30) Foreign Application Priority Data

Apr. 27, 2015 (CN) .......................... 2015 1 0206100

(51) Int. Cl.
*H01L 27/12*     (2006.01)
*H01L 29/786*    (2006.01)
(Continued)

(52) U.S. Cl.
CPC .... *H01L 27/1255* (2013.01); *H01L 21/47573* (2013.01); *H01L 27/1225* (2013.01);
(Continued)

(58) Field of Classification Search
CPC .......... H01L 27/1255; H01L 21/02271; H01L 21/0274; H01L 21/47573; H01L 27/1225; H01L 27/1248
(Continued)

(56) References Cited

U.S. PATENT DOCUMENTS 6,278,131 B1 * 8/2001 Yamazaki ........... H01L 27/1237
257/347
7,351,623 B2 * 4/2008 Ahn .................. G02F 1/136286
257/E27.111

(Continued)

*Primary Examiner* — Ori Nadav
(74) *Attorney, Agent, or Firm* — Leong C. Lei

(57) ABSTRACT

The present invention provides a thin-film transistor array substrate and a manufacturing method thereof. In the thin-film transistor array substrate of the present invention, the portion of the gate insulation layer interposed between two electrode plates of the storage capacitor is smaller than that of the remaining portion of the gate insulation layer so that the thickness of the insulation layer of the storage capacitor is reduced and the area of the opposite surfaces of the capacitor can be made smaller and an increased aperture ratio can be achieved. The manufacturing method of a thin-film transistor array substrate of the present invention provides uses a half tone masking operation and applies two etching operations to have a portion of a gate insulation layer that is located on a first electrode plate of a storage capacitor partially etched so as to reduce the thickness thereof, thereby reducing the thickness of the internal insulation layer of the storage capacitor, whereby the area of the opposite surfaces of the capacitor electrode plates can be reduced under the condition of achieving the same capacitance and thus the aperture ratio is increased.

11 Claims, 5 Drawing Sheets

(51) Int. Cl.
*H01L 29/49* (2006.01)
*H01L 29/423* (2006.01)
*H01L 21/4757* (2006.01)
*H01L 29/51* (2006.01)

(52) U.S. Cl.
CPC ...... *H01L 27/1248* (2013.01); *H01L 27/1288* (2013.01); *H01L 29/42356* (2013.01); *H01L 29/4908* (2013.01); *H01L 29/7869* (2013.01); *H01L 29/517* (2013.01); *H01L 29/518* (2013.01)

(58) Field of Classification Search
USPC .......................................................... 257/43
See application file for complete search history.

(56) References Cited

U.S. PATENT DOCUMENTS

| | | | | |
|---|---|---|---|---|
| 7,518,666 B2* | 4/2009 | Jung | ................. | G02F 1/136213 349/43 |
| 2004/0048407 A1* | 3/2004 | Lee | ................... | H01L 27/1288 438/30 |
| 2005/0270434 A1* | 12/2005 | Jung | ................. | G02F 1/136213 349/43 |
| 2006/0145162 A1* | 7/2006 | Yang | ................... | G02F 1/13454 257/72 |
| 2007/0029609 A1* | 2/2007 | Park | ................. | G02F 1/136213 257/340 |
| 2011/0297929 A1* | 12/2011 | Liu | ................... | H01L 27/1214 257/43 |

* cited by examiner

THIN-FILM TRANSISTOR ARRAY SUBSTRATE AND MANUFACTURING METHOD THEREOF

BACKGROUND OF THE INVENTION

1. Field of the Invention

The present invention relates to the field of flat panel displays, and in particular to a thin-film transistor array substrate and a manufacturing method thereof.

2. The Related Arts

Active matrix flat panel displays have various advantages, including thin device body, low power consumption, and being free of radiations, and have been widely used. The flat panel displays that are currently available in the market include liquid crystal displays (LCDs) and organic light-emitting diode (OLED) displays.

An LCD comprises a liquid crystal display panel and a backlight module. The principle of operation of the liquid crystal display panel is that with liquid crystal molecules interposed between two parallel glass substrates, electricity is applied to the glass substrates to control if the direction of the liquid crystal molecules is changed so as to refract out light from the backlight module to generate an image.

An OLED has characteristics including being self-luminous, high brightness, wide view angle, high contrast, being flexible, and lower power consumption and has attracted wide attention as being a new generation displaying measure that has gradually taken the place of the traditional LCDs and has been widely used in mobile phone screens, computer monitors, and full-color televisions. The OLED display technology is different from the traditional liquid crystal display technology and requires no backlighting and involves extremely thin organic material coating layer and glass substrate, wherein when electricity is conducted to flow therethrough, the organic material gets luminous.

Thin-film transistor array substrates have been widely used in LCDs and OLEDs and generally comprise a glass base plate and thin-film transistors and storage capacitors formed on the glass base plate.

The storage capacitors play an important role of maintaining electrical potential and reducing divided voltage of coupling capacitors. Generally speaking, it is desired to have a relatively large capacitance. Capacitance is calculated according to the formula: $C=\varepsilon S/D$, where S is surface area and D is thickness of insulation. To change the capacitance of a storage capacitor, several ways may be taken; (1) using an insulation material having a large dielectric constant; (2) increasing the surface area; and (3) reducing the thickness of the insulation material.

Generally speaking, expanding the areas of opposite surfaces of two metal plates would increase capacitance. However, since a storage capacitor is made up of an insulation layer interposed between metals and the metal electrodes are generally not light transmittable, the larger the storage capacitor is, the smaller the aperture ratio would be. Reducing the thickness of the insulation layer can increase the storage capacitance and may also, on the same basis, allows for reduction of the areas of the opposite surfaces of the metal plates, and is thus considered a better way of increasing the storage capacitance and simultaneously increasing the aperture ratio.

Referring to FIG. 1, a cross-sectional view is given to illustrate the structure of a conventional thin-film transistor array substrate, which comprises a base plate 100 and a thin-film transistor and a storage capacitor formed on the base plate 100. The storage capacitor comprises a first electrode plate 310 and a second electrode plate 320 between which a gate insulation layer 300 and an etch stop layer 500 are interposed. Since the gate insulation layer 300 and the etch stop layer 500 each have a certain thickness, the insulation layer, as a whole, is thus relatively thick, requiring a relatively large area of opposite surfaces to provide a desired capacitance thereby making the aperture ratio of the device lowered.

SUMMARY OF THE INVENTION

An object of the present invention is to provide a thin-film transistor array substrate, which provides a relatively large storage capacitance, while achieving a relatively large aperture ratio.

An object of the present invention is to provide a manufacturing method of a thin-film transistor array substrate that can increase a storage capacitance and at the same time also increases an aperture ratio.

To achieve the above objects, the present invention provides a thin-film transistor array substrate, which comprises a base plate and a thin-film transistor and a storage capacitor formed on the base plate;

the storage capacitor comprising a first electrode plate arranged on the base plate, a second electrode plate located above the first electrode plate, a gate insulation layer located between the first electrode plate and the second electrode plate and arranged on the first electrode plate, an etch stop layer located between the first electrode plate and the second electrode plate and arranged on the gate insulation layer;

the gate insulation layer having a portion that corresponds to and is located above the first electrode plate and has a thickness smaller than a thickness of a remaining portion of the gate insulation layer.

The thin-film transistor array substrate comprises a base plate, a first gate terminal, a second gate terminal, and a first electrode plate that is located at one side of the second gate terminal that is distant from the first gate terminal arranged on the base plate, a gate insulation layer arranged on the first gate terminal, the second gate terminal, the first electrode plate, and the base plate, a first oxide semiconductor layer and a second oxide semiconductor layer arranged on the gate insulation layer to be respectively located above the first gate terminal and the second gate terminal, an etch stop layer arranged on the first oxide semiconductor layer, the second oxide semiconductor layer, and the gate insulation layer, a first source terminal and a first drain terminal and a second source terminal and a second drain terminal arranged on the etch stop layer to be respectively located on the first gate terminal and the second gate terminal, a second electrode plate arranged on the etch stop layer to be located above the first electrode plate; a passivation layer arranged on the first source terminal, the first drain terminal, the second source terminal, the second drain terminal, and the second electrode plate and covering the etch stop layer, a planarization layer arranged on the passivation layer, a pixel electrode layer arranged on the planarization layer, a pixel definition layer arranged on the planarization layer and the pixel electrode layer, and a photoresist spacer arranged on the pixel definition layer;

the gate insulation layer comprising a first via formed therein to correspond to and located above a side portion of the second gate terminal that is adjacent to the first gate terminal, the passivation layer and the planarization layer comprising a second via formed therein to correspond to and be located above the second source terminal, the pixel definition layer comprising a third via formed therein to correspond to and be located above the pixel electrode layer, the first source terminal and the first drain terminal being in contact engagement with the first oxide semiconductor layer, the second source terminal and the second drain terminal being in contact engagement with the second oxide semiconductor layer, the first source terminal being set in contact engagement with the second gate terminal through the first via, the pixel electrode layer being set in contact engagement with the second source terminal through the second via, the third via exposing a portion of the pixel electrode layer;

the first gate terminal, the second gate terminal, the gate insulation layer, the first oxide semiconductor layer, the second oxide semiconductor layer, the etch stop layer, the first source terminal, the first drain terminal, the second source terminal, and the second drain terminal constituting the thin-film transistor;

the first electrode plate, the second electrode plate, and the gate insulation layer and the etch stop layer that are located between the first electrode plate and the second electrode plate constituting the storage capacitor.

The gate insulation layer comprises a material of one of aluminum oxide, silicon nitride, and silicon oxide, or a combination thereof.

The present invention also provides a manufacturing method of a thin-film transistor array substrate, which comprises the following steps:

(1) providing a base plate, depositing a first metal layer on the base plate and subjecting the first metal layer to patternization so as to form a first gate terminal, a second gate terminal, and a first electrode plate located at one side of the second gate terminal that is distant from the first gate terminal;

(2) depositing a gate insulation layer on the first metal layer;

(3) coating a photoresist layer on the gate insulation layer and using a half tone mask to subject the photoresist layer to exposure and development so as to form a full exposure zone that corresponds to and is located above a location between the first gate terminal and the second gate terminal and a side portion of the second gate terminal that is adjacent to the first gate terminal and a partial exposure zone that corresponds to and is located above the first electrode plate;

(4) subjecting a portion of the gate insulation layer that is located below the full exposure zone to a first etching operation by using the photoresist layer as a shielding layer so as to form a first via and remove a portion of the photoresist layer corresponding to the partial exposure zone;

(5) subjecting a portion of the gate insulation layer that is located above the first electrode plate to a second etching operation by using the photoresist layer as a shielding layer so as to provide the portion of the gate insulation layer that corresponds to and is located above the first electrode plate with a thickness that is smaller than a thickness of a remaining portion of the gate insulation layer; and (6) peeling off the photoresist layer and forming, in sequence, a first oxide semiconductor layer and a second oxide semiconductor layer, an etch stop layer, a first source terminal and a first drain terminal, a second source terminal and a second drain terminal, a second electrode plate, a passivation layer, a planarization layer, a pixel electrode layer, a pixel definition layer, and a photoresist spacer on the gate insulation layer.

In step (2), chemical vapor deposition is used to deposit the gate insulation layer.

In step (4), the first etching operation is conducted with dry etching and oxygen ashing is used to remove the portion of the photoresist layer corresponding to the partial exposure zone.

In step (5), the second etching operation is conducted with dry etching.

In step (5), controlling of the thickness of the portion of the gate insulation layer that corresponds to and is located above the first electrode plate is achieved according to rate of the second etching operation.

The gate insulation layer comprises a material of one of aluminum oxide, silicon nitride, and silicon oxide, or a combination thereof.

The first source terminal and the first drain terminal are respectively set in contact engagement with opposite side portions of the first oxide semiconductor layer and the second source terminal and the second drain terminal are respectively set in contact engagement with opposite side portions of the second oxide semiconductor layer, the first source terminal being set in contact engagement with the second gate terminal via the first via, the passivation layer and the planarization layer comprising a second via formed therein to correspond to and be located above the second source terminal, the pixel definition layer comprising a third via formed therein to correspond to and be located above the pixel electrode layer, the pixel electrode layer being set in contact engagement with the second source terminal through the second via, the third via exposing a portion of the pixel electrode layer.

The present invention further provides a manufacturing method of a thin-film transistor array substrate, which comprises the following steps:

(1) providing a base plate, depositing a first metal layer on the base plate and subjecting the first metal layer to patternization so as to form a first gate terminal, a second gate terminal, and a first electrode plate located at one side of the second gate terminal that is distant from the first gate terminal;

(2) depositing a gate insulation layer on the first metal layer;

(3) coating a photoresist layer on the gate insulation layer and using a half tone mask to subject the photoresist layer to exposure and development so as to form a full exposure zone that corresponds to and is located above a location between the first gate terminal and the second gate terminal and a side portion of the second gate terminal that is adjacent to the first gate terminal and a partial exposure zone that corresponds to and is located above the first electrode plate;

(4) subjecting a portion of the gate insulation layer that is located below the full exposure zone to a first etching operation by using the photoresist layer as a shielding layer so as to form a first via and remove a portion of the photoresist layer corresponding to the partial exposure zone;

(5) subjecting a portion of the gate insulation layer that is located above the first electrode plate to a second etching operation by using the photoresist layer as a shielding layer so as to provide the portion of the gate insulation layer that corresponds to and is located above the first electrode plate with a thickness that is smaller than a thickness of a remaining portion of the gate insulation layer; and (6) peeling off the photoresist layer and forming, in sequence, a first oxide semiconductor layer and a second oxide semiconductor layer, an etch stop layer, a first source terminal and a first drain terminal, a second source terminal and a second drain terminal, a second electrode plate, a passivation layer, a planarization layer, a pixel electrode layer, a pixel definition layer, and a photoresist spacer on the gate insulation layer;

wherein in step (2), chemical vapor deposition is used to deposit the gate insulation layer;

wherein in step (4), the first etching operation is conducted with dry etching and oxygen ashing is used to remove the portion of the photoresist layer corresponding to the partial exposure zone; and wherein in step (5), the second etching operation is conducted with dry etching.

The efficacy of the present invention is that the present invention provides a thin-film transistor array substrate, in which the portion of the gate insulation layer interposed between two electrode plates of the storage capacitor is smaller than that of the remaining portion of the gate insulation layer so that the thickness of the insulation layer of the storage capacitor is reduced and the area of the opposite surfaces of the capacitor can be made smaller and an increased aperture ratio can be achieved. The present invention provides a manufacturing method of a thin-film transistor array substrate, which uses a half tone masking operation and applies two etching operations to have a portion of a gate insulation layer that is located on a first electrode plate of a storage capacitor partially etched so as to reduce the thickness thereof, thereby reducing the thickness of the internal insulation layer of the storage capacitor, whereby the area of the opposite surfaces of the capacitor electrode plates can be reduced under the condition of achieving the same capacitance and thus the aperture ratio is increased.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
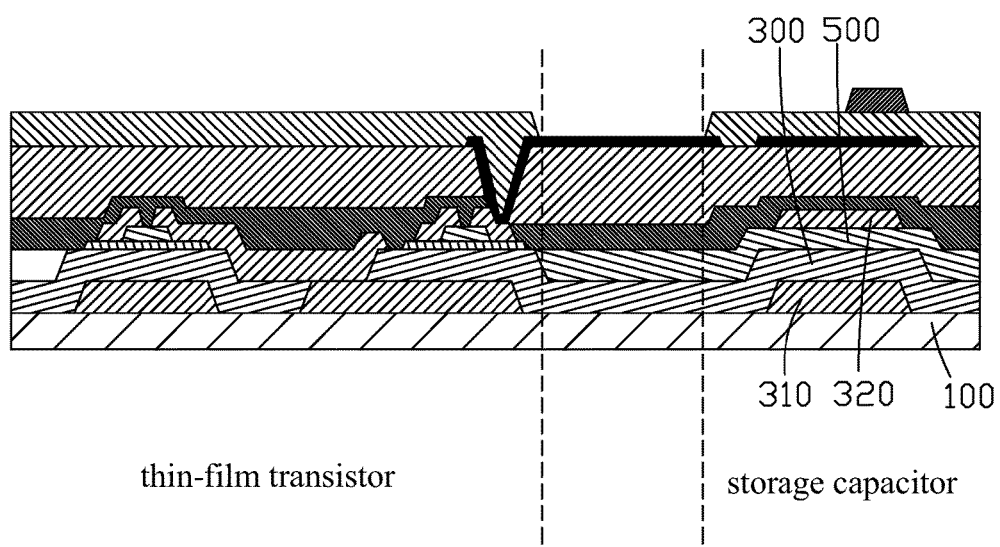
FIG. 1 is a cross-sectional view showing the structure of a conventional thin-film transistor array substrate.
Figure 2:
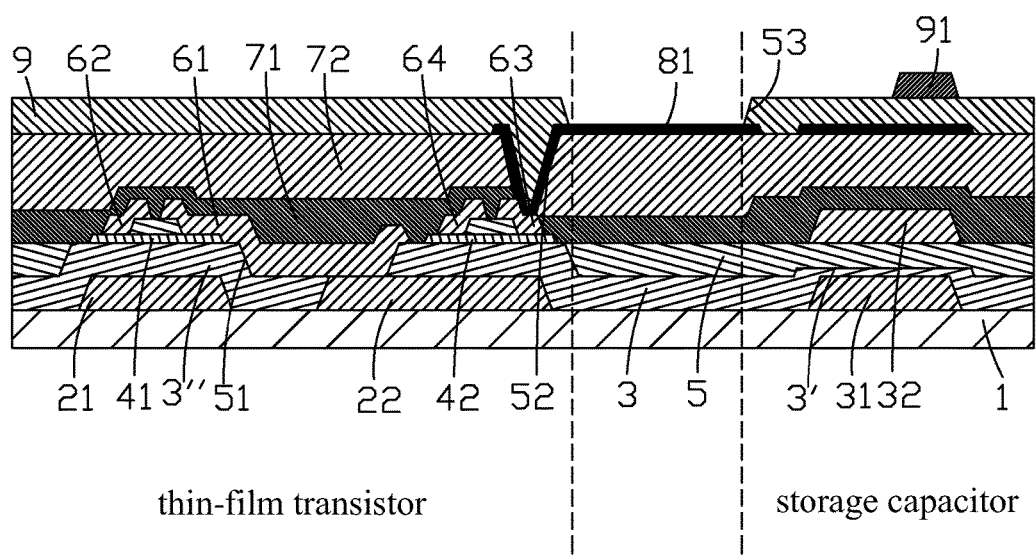
FIG. 2 is a cross-sectional view showing a thin-film transistor array substrate according to the present invention.

Referring to FIG. 2, the present invention provides a thin-film transistor array substrate, which comprises a base plate 1 and a thin-film transistor and a storage capacitor formed on the base plate 1.

The storage capacitor comprises a first electrode plate 31 arranged on the base plate 1, a second electrode plate 32 located above the first electrode plate 31, a gate insulation layer 3 located between the first electrode plate 31 and the second electrode plate 32 and arranged on the first electrode plate 31, an etch stop layer 5 located between the first electrode plate 31 and the second electrode plate 32 and arranged on the gate insulation layer 3.

The gate insulation layer 3 has a portion 3' that corresponds to and is located above the first electrode plate 31 and has a thickness smaller than a thickness of a remaining portion 3" of the gate insulation layer 3.

Specifically, as shown in FIG. 2, a cross-sectional view is given to illustrate an embodiment of the thin-film transistor array substrate according to the present invention is illustrated, which is a thin-film transistor array substrate having an etch stop (ES) structure and comprises a base plate 1, a first gate terminal 21, a second gate terminal 22, and a first electrode plate 31 that is located at one side of the second gate terminal 22 that is distant from the first gate terminal 21 arranged on the base plate 1, a gate insulation layer 3 arranged on the first gate terminal 21, the second gate terminal 22, the first electrode plate 31, and the base plate 1, a first oxide semiconductor layer 41 and a second oxide semiconductor layer 42 arranged on the gate insulation layer 3 to be respectively located above the first gate terminal 21 and the second gate terminal 22, an etch stop layer 5 arranged on the first oxide semiconductor layer 41, the second oxide semiconductor layer 42, and the gate insulation layer 3, a first source terminal 61 and a first drain terminal 62 and a second source terminal 63 and a second drain terminal 64 arranged on the etch stop layer 5 to be respectively located on the first gate terminal 21 and the second gate terminal 22, a second electrode plate 32 arranged on the etch stop layer 5 to be located above the first electrode plate 31, a passivation layer 71 arranged on the first source terminal 61, the first drain terminal 62, the second source terminal 63, the second drain terminal 64, and the second electrode plate 32 and covering the etch stop layer 5, a planarization layer 72 arranged on the passivation layer 71, a pixel electrode layer 81 arranged on the planarization layer 72, a pixel definition layer 9 arranged on the planarization layer 72 and the pixel electrode layer 81, and a photoresist spacer 91 arranged on the pixel definition layer 9.

The gate insulation layer 3 comprises a first via 51 formed therein to correspond to and located above a side portion of the second gate terminal 22 that is adjacent to the first gate terminal 21. The passivation layer 71 and the planarization layer 72 comprise a second via 52 formed therein to correspond to and be located above the second source terminal 63. The pixel definition layer 9 comprises a third via 53 formed therein to correspond to and be located above the pixel electrode layer 81. The first source terminal 61 and the first drain terminal 62 are in contact engagement with the first oxide semiconductor layer 41. The second source terminal 63 and the second drain terminal 64 are in contact engagement with the second oxide semiconductor layer 42. The first source terminal 61 is set in contact engagement with the second gate terminal 22 through the first via 51. The pixel electrode layer 81 is set in contact engagement with the second source terminal 63 through the second via 52. The third via 53 expose a portion of the pixel electrode layer 81.

The first gate terminal 21, the second gate terminal 22, the gate insulation layer 3, the first oxide semiconductor layer 41, the second oxide semiconductor layer 42, the etch stop layer 5, the first source terminal 61, the first drain terminal 62, the second source terminal 63, and the second drain terminal 64 constitute the thin-film transistor.

The first electrode plate 31, the second electrode plate 32, and the gate insulation layer 3 and the etch stop layer 5 that are located between the first electrode plate 31 and the second electrode plate 32 constitute the storage capacitor. Since the portion 3' of the gate insulation layer 3 that corresponds to the first electrode plate 31 has a thickness smaller than that of the remaining portion 3" of the gate insulation layer 3, the thickness of the insulation layer of the storage capacitor is reduced and the area of the opposite surfaces of the capacitor can be made smaller and an increased aperture ratio can be achieved.

Specifically, the gate insulation layer 3 comprises a material of one of aluminum oxide ($Al_2O_3$), silicon nitride (SiNx), and silicon oxide (SiOx), or a combination thereof.

It is noted here that besides the etch stopper (ES) structure described above, the thin-film transistor array substrate of the present invention is also applicable to a back channel etched (BCE) structure and a channel protected (CP) structure.

In the above-described thin-film transistor array substrate, the portion of the gate insulation layer interposed between two electrode plates of the storage capacitor is smaller than that of the remaining portion of the gate insulation layer so that the thickness of the insulation layer of the storage capacitor is reduced and the area of the opposite surfaces of the capacitor can be made smaller and an increased aperture ratio can be achieved.

Figure 3:
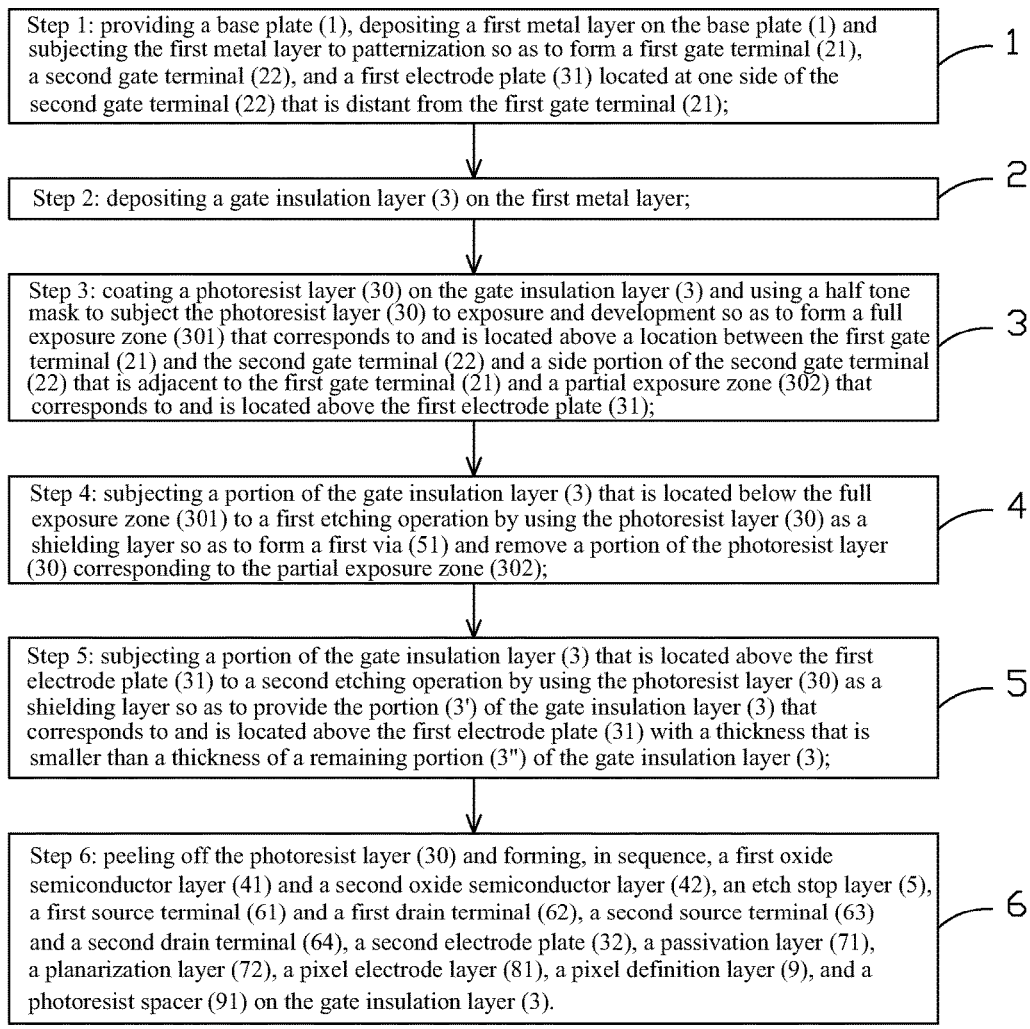
FIG. 3 is a flow chart illustrating a manufacturing method of a thin-film transistor array substrate according to the present invention.
Figure 4:
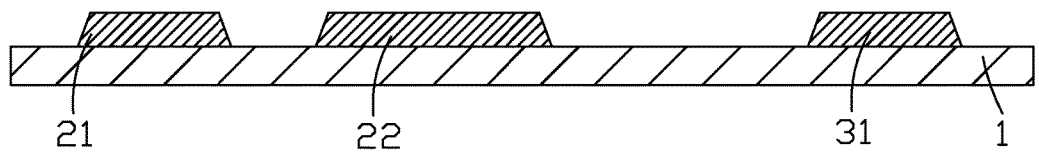
FIG. 4 is a schematic view illustrating a first step of the manufacturing method of the thin-film transistor array substrate according to the present invention.

Referring to FIG. 3, the present invention provides a manufacturing method of a thin-film transistor array substrate, which comprises the following steps:

Step 1: as shown in FIG. 4, providing a base plate 1, depositing a first metal layer on the base plate 1 and subjecting the first metal layer to patternization so as to form a first gate terminal 21, a second gate terminal 22, and a first electrode plate 31 located at one side of the second gate terminal 22 that is distant from the first gate terminal 21.

Figure 5:
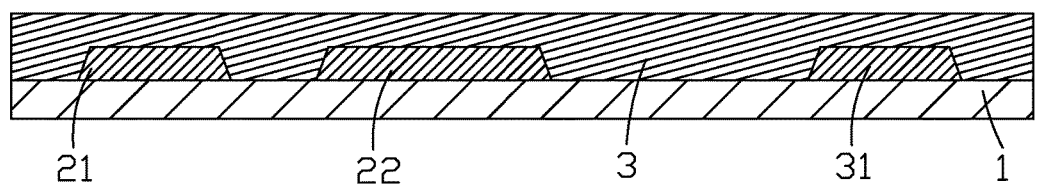
FIG. 5 is a schematic view illustrating a second step of the manufacturing method of the thin-film transistor array substrate according to the present invention.

Step 2: as shown in FIG. 5, depositing a gate insulation layer 3 on the first metal layer.

Specifically, chemical vapor deposition (CVD) is used to deposit the gate insulation layer 3 and the gate insulation layer 3 may comprise a material of one of aluminum oxide, silicon nitride, and silicon oxide, or a combination thereof.

Figure 6:
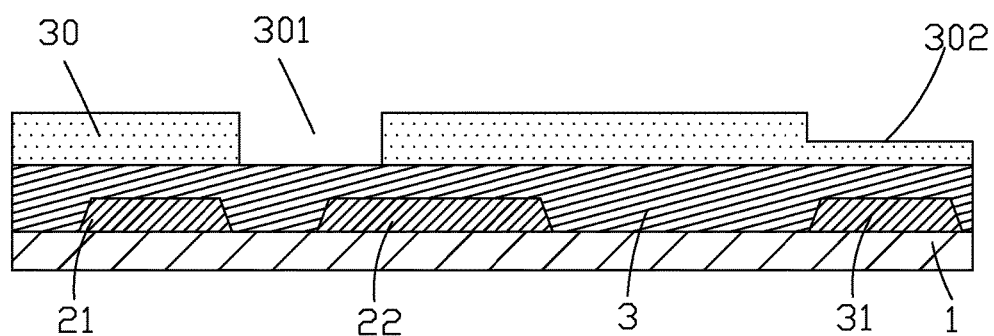
FIG. 6 is a schematic view illustrating a third step of the manufacturing method of the thin-film transistor array substrate according to the present invention.

Step 3: as shown in FIG. 6, coating a photoresist layer 30 on the gate insulation layer 3 and using a half tone mask to subject the photoresist layer 30 to exposure and development so as to form a full exposure zone 301 that corresponds to and is located above a location between the first gate terminal 21 and the second gate terminal 22 and a side portion of the second gate terminal 22 that is adjacent to the first gate terminal 21 and a partial exposure zone 302 that corresponds to and is located above the first electrode plate 31.

Figure 7:
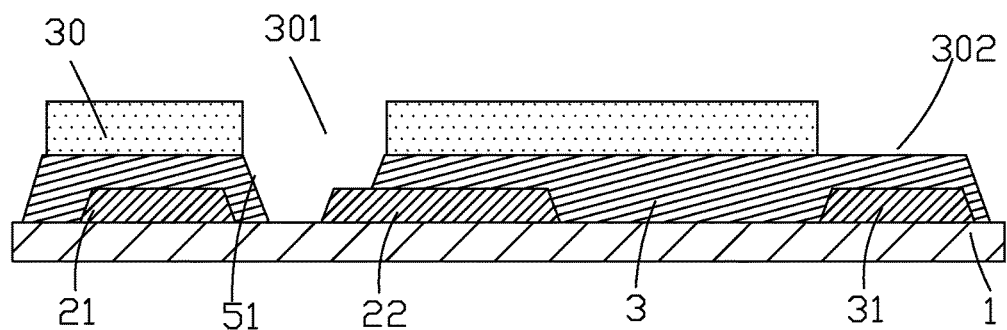
FIG. 7 is a schematic view illustrating a fourth step of the manufacturing method of the thin-film transistor array substrate according to the present invention.

Step 4: as shown in FIG. 7, subjecting a portion of the gate insulation layer 3 that is located below the full exposure zone 301 to a first etching operation by using the photoresist layer 30 as a shielding layer so as to form a first via 51 and remove a portion of the photoresist layer 30 corresponding to the partial exposure zone 302.

Specifically, the first etching operation is conducted with dry etching and oxygen ($O_2$) ashing is used to remove the portion of the photoresist layer 30 corresponding to the partial exposure zone 302.

Figure 8:
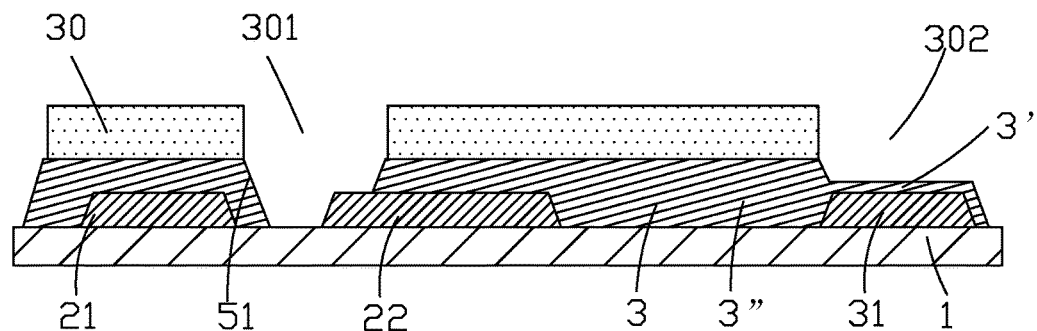
FIG. 8 is a schematic view illustrating a fifth step of the manufacturing method of the thin-film transistor array substrate according to the present invention.

Step 5: as shown in FIG. 8, subjecting a portion of the gate insulation layer 3 that is located above the first electrode plate 31 to a second etching operation by using the photoresist layer 30 as a shielding layer so as to provide the portion 3' of the gate insulation layer 3 that corresponds to and is located above the first electrode plate 31 with a thickness that is smaller than a thickness of a remaining portion 3" of the gate insulation layer 3.

Specifically, the second etching operation is conducted with dry etching so that the thickness of the portion 3' of the gate insulation layer 3 that corresponds to and is located above the first electrode plate 31 can be controlled according to the rate of the second etching operation.

Figure 9:
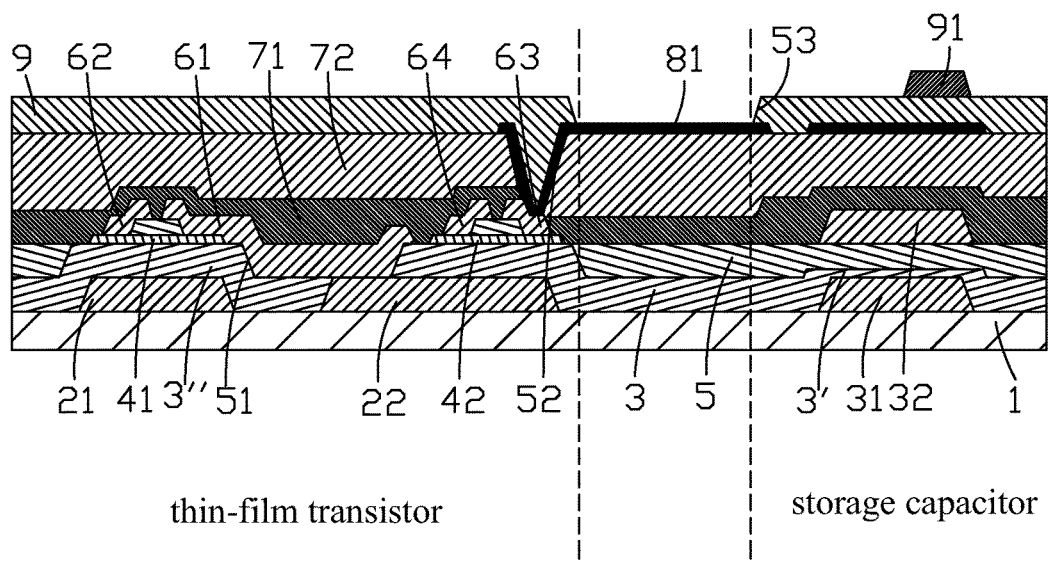
FIG. 9 is a schematic view illustrating a sixth step of the manufacturing method of the thin-film transistor array substrate according to the present invention.

Step 6: as shown in FIG. 9, peeling off the photoresist layer 30 and forming, in sequence, a first oxide semiconductor layer 41 and a second oxide semiconductor layer 42, an etch stop layer 5, a first source terminal 61 and a first drain terminal 62, a second source terminal 63 and a second drain terminal 64, a second electrode plate 32, a passivation layer 71, a planarization layer 72, a pixel electrode layer 81, a pixel definition layer 9, and a photoresist spacer 91 on the gate insulation layer 3.

Specifically, Step 6 can be achieved with any known techniques. The first source terminal 61 and the first drain terminal 62 are respectively set in contact engagement with opposite side portions of the first oxide semiconductor layer 41. The second source terminal 63 and the second drain terminal 64 are respectively set in contact engagement with opposite side portions of the second oxide semiconductor layer 42. The first source terminal 61 is set in contact engagement with the second gate terminal 22 via the first via 51. The passivation layer 71 and the planarization layer 72 comprise a second via 52 formed therein to correspond to and be located above the second source terminal 63. The pixel definition layer 9 comprises a third via 53 formed therein to correspond to and be located above the pixel electrode layer 81. The pixel electrode layer 81 is set in contact engagement with the second source terminal 63 through the second via 52. The third via 53 exposes a portion of the pixel electrode layer 81.

The first gate terminal 21, the second gate terminal 22, the gate insulation layer 3, the first oxide semiconductor layer 41, the second oxide semiconductor layer 42, the etch stop layer 5, the first source terminal 61, the first drain terminal 62, the second source terminal 63, and the second drain terminal 64 constitute the thin-film transistor.

The first electrode plate 31, the second electrode plate 32, and the gate insulation layer 3 and the etch stop layer 5 that are located between the first electrode plate 31 and the second electrode plate 32 constitute the storage capacitor. The portion 3' of the gate insulation layer 3 that corresponds to the first electrode plate 31 has a thickness smaller than that of the remaining portion 3″ of the gate insulation layer 3, so that the thickness of the insulation layer of the storage capacitor is reduced and the area of the opposite surfaces of the capacitor can be made smaller and an increased aperture ratio can be achieved.

The above-described manufacturing method of a thin-film transistor array substrate uses a half tone masking operation and applies two etching operations to have a portion of a gate insulation layer that is located on a first electrode plate of a storage capacitor partially etched so as to reduce the thickness thereof, thereby reducing the thickness of the internal insulation layer of the storage capacitor, whereby the area of the opposite surfaces of the capacitor electrode plates can be reduced under the condition of achieving the same capacitance and thus the aperture ratio is increased.

In summary, the present invention provides a thin-film transistor array substrate, in which the portion of the gate insulation layer interposed between two electrode plates of the storage capacitor is smaller than that of the remaining portion of the gate insulation layer so that the thickness of the insulation layer of the storage capacitor is reduced and the area of the opposite surfaces of the capacitor can be made smaller and an increased aperture ratio can be achieved. The present invention provides a manufacturing method of a thin-film transistor array substrate, which uses a half tone masking operation and applies two etching operations to have a portion of a gate insulation layer that is located on a first electrode plate of a storage capacitor partially etched so as to reduce the thickness thereof, thereby reducing the thickness of the internal insulation layer of the storage capacitor, whereby the area of the opposite surfaces of the capacitor electrode plates can be reduced under the condition of achieving the same capacitance and thus the aperture ratio is increased.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of a thin-film transistor array substrate, comprising the following steps:
   (1) providing a base plate, depositing a first metal layer on a surface of the base plate and subjecting the first metal layer to patternization so as to form a first gate terminal, a second gate terminal, and a first electrode plate located at one side of the second gate terminal that is distant from the first gate terminal;
   (2) depositing a gate insulation layer on the first metal layer;
   (3) coating a photoresist layer on the gate insulation layer and using a half tone mask to subject the photoresist layer to exposure and development so as to form a full exposure zone that corresponds to and is located above a location between the first gate terminal and the second gate terminal and a side portion of the second gate terminal that is adjacent to the first gate terminal and a partial exposure zone that corresponds to and is located above the first electrode plate;
   (4) subjecting a portion of the gate insulation layer that is located below the full exposure zone to a first etching operation by using the photoresist layer as a shielding layer so as to form a first via and remove a portion of the photoresist layer corresponding to the partial exposure zone;
   (5) subjecting a portion of the gate insulation layer that is located above the first electrode plate to a second etching operation by using the photoresist layer as a shielding layer so as to provide the portion of the gate insulation layer that corresponds to and is located above the first electrode plate with a thickness that is smaller than a thickness of a remaining portion of the gate insulation layer; and
   (6) peeling off the photoresist layer and forming, in sequence, a first oxide semiconductor layer and a second oxide semiconductor layer, an etch stop layer, a first source terminal and a first drain terminal, a second source terminal and a second drain terminal, a second electrode plate, a passivation layer, a planarization layer, a pixel electrode layer, a pixel definition layer, and a photoresist spacer on the gate insulation layer;
   wherein the portion of the gate insulation layer that is located above the first electrode plate and is subjected to the second etching operation to have a thickness smaller than a thickness of the remaining portion of the gate insulation layer is such that the portion of the gate insulation layer is raised above the remaining portion of the gate insulation layer and a top of the raised portion of the gate insulation layer is spaced from the surface of base plate by a first distance that is larger than a second distance by which a top of the remaining portion of the gate insulation layer is spaced from the surface of the base plate; and
   wherein the etch stop layer is formed so that a first portion of the etch stop layer that is located on the raised portion of the gate insulation layer has a top surface that is substantially consistent with a top surface of a second portion of the etch stop layer that is adjacent the first portion and located on the remaining portion of the gate insulation layer by providing the first portion and the second portion of the etch stop layer with a first material thickness and a second material thickness that are different from each other, such that a difference between the first material thickness and the second material thickness equals to a difference between the first distance and the second distance by which the raised portion and the remaining portion of the gate insulation layer are spaced from the surface of the base plate in order to provide a substantially continuous flat surface between the first portion and the second portion of the etch stop layer that correspond to the raised portion and the remaining portion of the gate insulation layer, wherein the second electrode plate is formed on the etch stop layer such that a distance between the second electrode plate, which is formed on the top surface of the first portion of the etch stop layer, and the first electrode plate is reduced through the raised portion of the gate insulation layer that corresponds to and is located above the first electrode being partly removed by the second etching operation.

2. The manufacturing method of the thin-film transistor array substrate as claimed in claim 1, wherein in step (2), chemical vapor deposition is used to deposit the gate insulation layer.

3. The manufacturing method of the thin-film transistor array substrate as claimed in claim 1, wherein in step (4), the first etching operation is conducted with dry etching and oxygen ashing is used to remove the portion of the photoresist layer corresponding to the partial exposure zone.

4. The manufacturing method of the thin-film transistor array substrate as claimed in claim 1, wherein in step (5), the second etching operation is conducted with dry etching.

5. The manufacturing method of the thin-film transistor array substrate as claimed in claim 4, wherein in step (5), controlling of the thickness of the portion of the gate insulation layer that corresponds to and is located above the first electrode plate is achieved according to rate of the second etching operation.

6. The manufacturing method of the thin-film transistor array substrate as claimed in claim 1, wherein the gate insulation layer comprises a material of one of aluminum oxide, silicon nitride, and silicon oxide, or a combination thereof.

7. The manufacturing method of the thin-film transistor array substrate as claimed in claim 1, wherein the first source terminal and the first drain terminal are respectively set in contact engagement with opposite side portions of the first oxide semiconductor layer and the second source terminal and the second drain terminal are respectively set in contact engagement with opposite side portions of the second oxide semiconductor layer, the first source terminal being set in contact engagement with the second gate terminal via the first via, the passivation layer and the planarization layer comprising a second via formed therein to correspond to and be located above the second source terminal, the pixel definition layer comprising a third via formed therein to correspond to and be located above the pixel electrode layer, the pixel electrode layer being set in contact engagement with the second source terminal through the second via, the third via exposing a portion of the pixel electrode layer.

8. A manufacturing method of a thin-film transistor array substrate, comprising the following steps:
(1) providing a base plate, depositing a first metal layer on the base plate and subjecting the first metal layer to patternization so as to form a first gate terminal, a second gate terminal, and a first electrode plate located at one side of the second gate terminal that is distant from the first gate terminal;
(2) depositing a gate insulation layer on the first metal layer;
(3) coating a photoresist layer on the gate insulation layer and using a half tone mask to subject the photoresist layer to exposure and development so as to form a full exposure zone that corresponds to and is located above a location between the first gate terminal and the second gate terminal and a side portion of the second gate terminal that is adjacent to the first gate terminal and a partial exposure zone that corresponds to and is located above the first electrode plate;
(4) subjecting a portion of the gate insulation layer that is located below the full exposure zone to a first etching operation by using the photoresist layer as a shielding layer so as to form a first via and remove a portion of the photoresist layer corresponding to the partial exposure zone;
(5) subjecting a portion of the gate insulation layer that is located above the first electrode plate to a second etching operation by using the photoresist layer as a shielding layer so as to provide the portion of the gate insulation layer that corresponds to and is located above the first electrode plate with a thickness that is smaller than a thickness of a remaining portion of the gate insulation layer; and
(6) peeling off the photoresist layer and forming, in sequence, a first oxide semiconductor layer and a second oxide semiconductor layer, an etch stop layer, a first source terminal and a first drain terminal, a second source terminal and a second drain terminal, a second electrode plate, a passivation layer, a planarization layer, a pixel electrode layer, a pixel definition layer, and a photoresist spacer on the gate insulation layer;
wherein in step (2), chemical vapor deposition is used to deposit the gate insulation layer;
wherein in step (4), the first etching operation is conducted with dry etching and oxygen ashing is used to remove the portion of the photoresist layer corresponding to the partial exposure zone;
wherein in step (5), the second etching operation is conducted with dry etching;
wherein the portion of the gate insulation layer that is located above the first electrode plate and is subjected to the second etching operation to have a thickness smaller than a thickness of the remaining portion of the gate insulation layer is such that the portion of the gate insulation layer is raised above the remaining portion of the gate insulation layer and a top of the raised portion of the gate insulation layer is spaced from the surface of base plate by a first distance that is larger than a second distance by which a top of the remaining portion of the gate insulation layer is spaced from the surface of the base plate; and
wherein the etch stop layer is formed so that a first portion of the etch stop layer that is located on the raised portion of the gate insulation layer has a top surface that is substantially consistent with a top surface of a second portion of the etch stop layer that is adjacent the first portion and located on the remaining portion of the gate insulation layer by providing the first portion and the second portion of the etch stop layer with a first material thickness and a second material thickness that are different from each other, such that a difference between the first material thickness and the second material thickness equals to a difference between the first distance and the second distance by which the raised portion and the remaining portion of the gate insulation layer are spaced from the surface of the base plate in order to provide a substantially continuous flat surface between the first portion and the second portion of the etch stop layer that correspond to the raised portion and the remaining portion of the gate insulation layer, wherein the second electrode plate is formed on the etch top layer such that a distance between the second electrode plate, which is formed on the top surface of the first portion of the etch stop layer, and the first electrode plate is reduced through the raised portion of the gate insulation layer that corresponds to and is located above the first electrode being partly removed by the second etching operation.

9. The manufacturing method of the thin-film transistor array substrate as claimed in claim 8, wherein in step (5), controlling of the thickness of the portion of the gate insulation layer that corresponds to and is located above the first electrode plate is achieved according to rate of the second etching operation.

10. The manufacturing method of the thin-film transistor array substrate as claimed in claim 8, wherein the gate insulation layer comprises a material of one of aluminum oxide, silicon nitride, and silicon oxide, or a combination thereof.

11. The manufacturing method of the thin-film transistor array substrate as claimed in claim 8, wherein the first source terminal and the first drain terminal are respectively set in contact engagement with opposite side portions of the first oxide semiconductor layer and the second source terminal and the second drain terminal are respectively set in contact engagement with opposite side portions of the second oxide semiconductor layer, the first source terminal being set in contact engagement with the second gate terminal via the first via, the passivation layer and the planarization layer comprising a second via formed therein to correspond to and be located above the second source terminal, the pixel definition layer comprising a third via formed therein to correspond to and be located above the pixel electrode layer, the pixel electrode layer being set in contact engagement with the second source terminal through the second via, the third via exposing a portion of the pixel electrode layer.

* * * * *